(12) United States Patent
Hübel

(10) Patent No.: US 7,449,089 B2
(45) Date of Patent: Nov. 11, 2008

(54) CONVEYORIZED PLATING LINE AND METHOD FOR ELECTROLYTICALLY METAL PLATING A WORKPIECE

(75) Inventor: Egon Hübel, Feucht (DE)

(73) Assignee: Atotech Deutschland GmbH, Berlin (DE)

( * ) Notice: Subject to any disclaimer, the term of this patent is extended or adjusted under 35 U.S.C. 154(b) by 888 days.

(21) Appl. No.: 10/502,187

(22) PCT Filed: Mar. 17, 2003

(86) PCT No.: PCT/EP03/02763

§ 371 (c)(1),
(2), (4) Date: Jul. 21, 2004

(87) PCT Pub. No.: WO03/083185

PCT Pub. Date: Oct. 9, 2003

(65) Prior Publication Data

US 2005/0077185 A1    Apr. 14, 2005

(30) Foreign Application Priority Data

Mar. 28, 2002  (DE) ................................ 102 15 463

(51) Int. Cl.
*C25D 17/10*    (2006.01)
*C25D 21/10*    (2006.01)

(52) U.S. Cl. ............... 204/198; 204/230.2; 204/230.7
(58) Field of Classification Search ............... None
See application file for complete search history.

(56) References Cited

U.S. PATENT DOCUMENTS

| 3,643,670 | A |   | 2/1972  | Sabatka et al. |
|-----------|---|---|---------|----------------|
| 4,776,939 | A |   | 10/1988 | Blasing et al. |
| 4,959,137 | A |   | 9/1990  | Matsuoka et al.|
| 5,024,732 | A | * | 6/1991  | Hubel ............ 205/80 |
| 5,292,424 | A |   | 3/1994  | Blasing et al. |

FOREIGN PATENT DOCUMENTS

| DE | 3236545 A1 |   | 5/1983  |
|----|------------|---|---------|
| DE | 3624481 A1 |   | 1/1988  |
| EP | 1160846 A2 | * | 12/2001 |

OTHER PUBLICATIONS

Patent Abstracts of Japan, vol. 009, No. 241, Sep. 27, 1985, Shin Nippon Seitetsu.

* cited by examiner

*Primary Examiner*—Harry D Wilkins, III
(74) *Attorney, Agent, or Firm*—Paul & Paul

(57) ABSTRACT

To avoid voids in the metal layer in holes of printed circuit boards, a conveyorized plating line and a method for electrolytically metal plated printed circuit boards are proposed which provide measures for reducing an electric voltage that builds up between adjacent printed circuit boards being conveyed through the line.

12 Claims, 5 Drawing Sheets

CONVEYORIZED PLATING LINE AND METHOD FOR ELECTROLYTICALLY METAL PLATING A WORKPIECE

The invention relates to a conveyorized plating line for electrolytically metal plating a workpiece and to a method for electrolytically metal plating a workpiece in a conveyorized plating line.

A such type conveyorized plating line is described in DE 36 24 481 A1. The electrolytic cells with the anodes and the workpiece employed as a cathode are placed in a tank. An electrolyte is kept in a storage tank and is delivered to the work space by means of pumps. The conveying members are clamps. In the work space, endless revolving clamps disposed on a belt perform the functions of supplying the current and of conveying the printed circuit boards and the printed circuit foils.

In other lines, the current is supplied to the work through driven contact wheels. The contact wheels may also serve to convey the work through the line. Such a line with contact wheels is described in DE 32 36 545 A1.

Horizontal conveyorized plating lines are also known in which the work is vertically hung from revolving conveying means, using clamps (U.S. Pat. No. 3,643,670).

The known lines have the advantage that the printed circuit boards can be manufactured efficiently since very little handling is needed.

However, it has been found that, in the holes made in the printed circuit boards, voids form in the copper layer which in such lines is electrolytically deposited on the walls of the holes. Voids also occur in the same way while the entire exterior surface of the printed circuit boards is being electrolytically copper-plated, using for example the sequential build-up technique for manufacturing these boards. With this technique, a thin layer of copper is at first electroless plated on the exterior side of a printed circuit board material having no copper layer, the thus obtained copper layer being then electrolytically reinforced.

Accordingly, it is the object of the present invention to manufacture workpieces, more specifically printed circuit boards and other circuit carriers, in plating lines without such voids occurring in the electrolytic metal layer.

The object is achieved by the conveyorized plating line for electrolytically metal plating according to claim 1 and by the method for electrolytically metal plating in a conveyorized plating line according to claim 14. Preferred embodiments of the invention are recited in the subordinate claims.

The conveyorized plating line according to the invention serves for the electrolytic metal plating of workpieces (work), more specifically of printed circuit boards and other circuit carriers such as hybrid integrated circuit carriers, more specifically multi-chip modules. In the plating line, the workpieces can be conveyed one behind the other more specifically in a horizontal direction of transport and preferably in a horizontal plane of transportation (or possibly also in a vertical plane of transportation) by means of suited conveying means. The line is provided with means for contacting the workpieces with an electrolyte fluid while they are being conveyed through the line. Further, at least one electric contacting facility for the workpieces, and preferably anodes preferably arranged substantially parallel to the conveying path as well, are provided together with at least one current supply (current source).

When the conveyorized plating line for the electrolytic metal plating of workpieces is in operation, said workpieces are fed to the line through which they are conveyed, more specifically in a horizontal direction of transport, by means of conveying means before they exit the line again. While the workpieces are being passed through the line, they are contacted with an electrolyte fluid and are electrically connected to a current supply through at least one electrical contacting member.

It has been found that an electric voltage (potential difference) is generated between adjacent workpieces (directly following each other in the line) that are being conveyed through the line. Such a conveyorized plating line is suited for preventing the voids mentioned from forming during electrolytic metal plating when means are provided for reducing, more specifically minimizing, said electric voltage.

In the specification of the invention that follows, reference will be made to printed circuit boards only. However, the invention is directed in the same way to other circuit carriers and other work as well that are suited for being processed in such a conveyorized line. In so far, the more general term "workpieces" may be substituted for the term "printed circuit board" throughout the present specification.

The printed circuit boards may for example be placed in electric contact by means of clamps or contact wheels for example. These electrical contacting members are also capable of concurrently conveying the printed circuit boards through the line. The printed circuit boards are cathodically connected for electroplating.

As the printed circuit boards enter a processing station of such a conveyorized plating line, they are passed through four different zones:

Zone A: The printed circuit boards are fed to the line in an electrolyte-free medium. The printed circuit boards generally enter the plating line in rapid succession, spaced a small distance from each other. The spacing between adjacent printed circuit boards, as viewed in the direction of transport, typically amounts to about 10 mm.

Zone B: The printed circuit boards are for example passed through entrance slots provided in partition walls and through sealing rolls or other sealing means and reach the electrolyte (entrance region). In this region, electrolytic reactions may take place at the surface of the printed circuit boards.

Zone C: The printed circuit boards are placed in electric contact and are connected to a pole of a plating current source (transition region).

Zone D: The printed circuit boards reach the region of the anodes (processing region). There they form, together with the anodes, the electrolytic cell for the treatment intended.

Tests showed that in conventional conveyorized plating lines the copper surfaces on the printed circuit boards are electrochemically etched in the entrance region in which the printed circuit boards are already contacted with the electrolyte fluid but are not yet placed in electric contact and have not yet reached the region of the anodes, which is not convenient. Such an etch attack may be observed with all of the currently used electrolytes and is almost independent of the type of the anodes. This attack is particularly inconvenient when very thin copper layers are used. In some regions of the printed circuit boards, the copper layers, which are necessary for electroplating, are completely dissolved. Scrap material may thus be generated during production.

This effect is to be observed between the boards that are conveyed one behind the other. Tests showed that the relationship between the border region of one printed circuit board and the border region of an adjacent board leads to a disturbing potential difference between the adjacent boards. In the zones B to D, a local electrolytic cell with differing cell voltages thus forms between the two adjacent boards.

Accordingly, the anodically polarized border region of one of the two adjacent printed circuit boards is electrochemically etched. The etch rate substantially is a function of the cell voltage, of the spacing between the adjacent boards and of the processing time of the printed circuit boards, i.e., the speed at which they are transported. As a result of the peak effect of the electric field, the edges in the border region of this board will be etched more than plane regions in these border regions. Such edges form e.g., the entrance of through holes and blind holes in the printed circuit boards.

Prior to electrolytic plating, these drilled holes are metal plated via an external current-free chemical (electroless) method and are thus rendered electrically conductive. As compared to electrolytic metal plating, these chemical metal plating methods are technically complicated and expensive. One tries to only use very thin layers during chemical metal plating. A typical layer thickness for chemical copper plating is for example 0.2 μm. The base metal layers at the surfaces of the printed circuit boards are generally much thicker, e.g., of 5-17 μm thick. These layers are not at risk when exposed to an electrochemical etch attack in the entrance region of the plating line. The thin chemical copper layer deposited over the entire surface using the SBU technique however is also affected by the etch attack, at least in the zones B and C. Not before the printed circuit boards reach region D in the actual electrolytic cell are the printed circuit boards electroplated all over. Generally, the printed circuit boards are not etched in this zone.

The circumstances in which the electroplating process is carried out in prior art lines will be described herein after in closer detail with reference to the FIGS. 1 and 2 which will permit to thereafter explain the functioning of the present invention.

Figure 1:
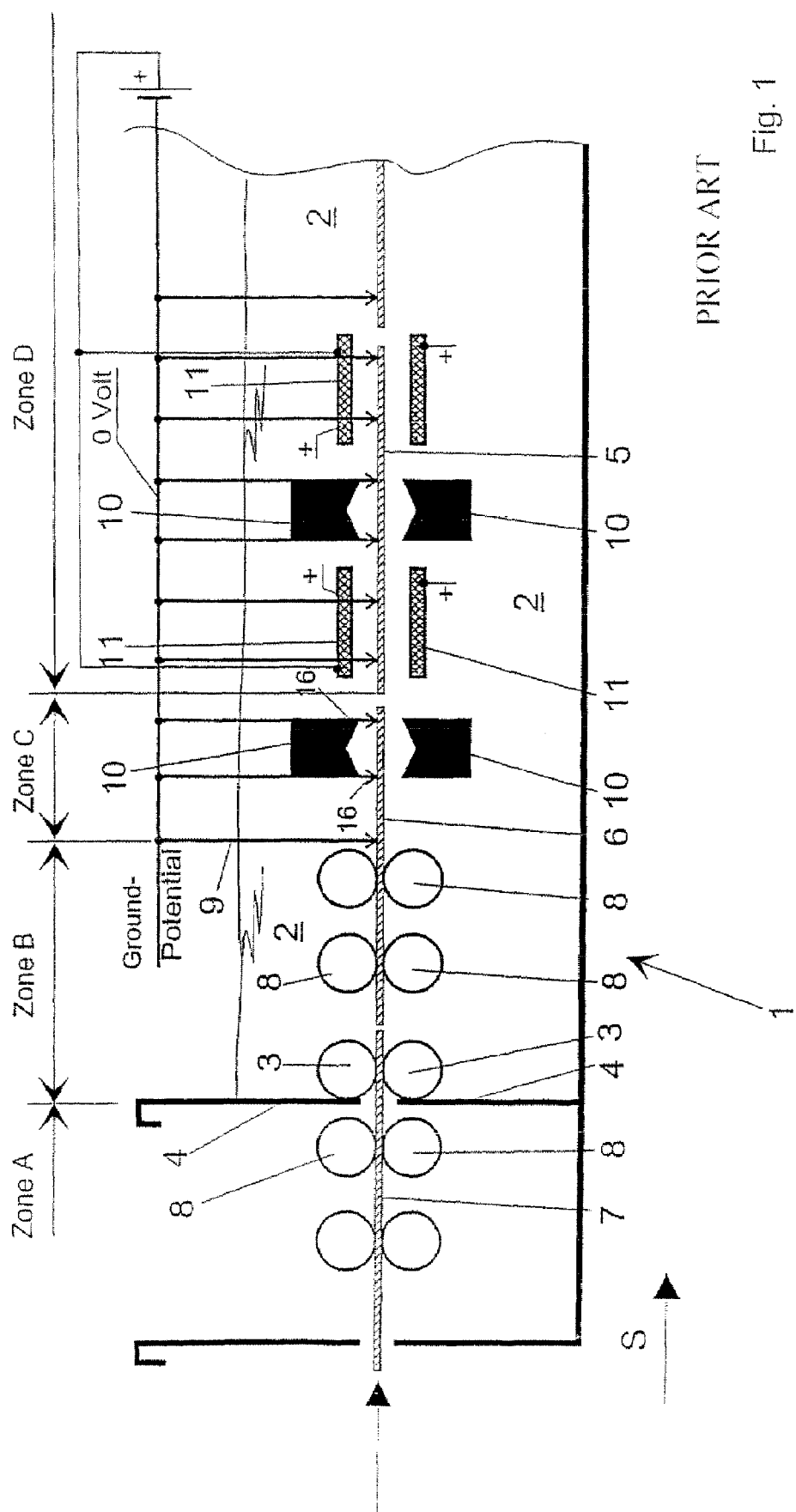
FIG. 1 is a schematic cross-sectional view of the front region of a prior art conveyorized plating line.

FIG. 1 shows a plating tank 1 of a conveyorized plating line the electrolyte space 2 of which is filled with an electrolyte fluid that is collected in the line by means of sealing rolls 3 and of a sealing wall 4. By means of transport rollers 8, the printed circuit boards 5,6,7 are conveyed in the direction of transport, which is indicated by an arrow, to the conveyorized plating line and are passed there through. The incoming printed circuit boards 5,6,7 reach the electrolyte space 2 in the region of the sealing rollers 3. At the first contacting member 9, the boards 5,6,7 are for the first time placed in electric contact with the negative pole of a plating current source schematically shown on the right upper margin of the Fig. by means of a metallic contact. Further electrical contacting members 16 that supply the electroplating current to the printed circuit boards 5,6,7 are arranged along the transport path.

The numeral 10 identifies members for delivering the electrolyte fluid to the surfaces of the printed circuit boards 5,6,7. Such delivering members may for example be flow nozzles, jet nozzles or spray nozzles. The numeral 11 further identifies anodes that are, in the present case, disposed substantially parallel to the conveying path on which the printed circuit boards 5,6,7 are transported and that extend at least over the entire width of the conveying path. The anodes 11 utilized may be conventional anode boxes with soluble anode material such as copper balls for depositing copper or may be insoluble anodes made from titanium, special steel or from another material.

According to FIG. 1, the printed circuit board 5 is located farthest inside the line, in the region of the electrolyte delivering members 10, the flow nozzles for example, and in the region of the anodes 11. This region of the line is called Zone D (processing region). In Zone D, the printed circuit board 5 is entirely placed in electric contact. At the same time, it is located completely within the electrolytic cell formed by the very printed circuit board 5 and by the anodes 11. The board 5 is electroplated on the entire surface thereof—both on the one exterior side and on the other exterior side—as anodes 11 are provided on either side of the conveying path for the printed circuit board 5.

In Zone C (transition range), the printed circuit board 6 is already placed in electric contact through the contacting members 9 and 16. As no anodes 11 are provided in this region though, the electroplating current that flows onto this printed circuit board 6 in this zone is not efficient.

In Zone B (entrance region), the printed circuit board 6 is already placed in electric contact through the contacting member 9 as well and behaves like in Zone C.

Printed circuit board 7, by contrast, already has the front region thereof in Zone B in the electrolyte space 2 but has not yet been placed in electric contact like printed circuit board 6.

In Zone A there is no electrolyte. This region has no electrolytic effect.

As the printed circuit boards 5,6,7 are conveyed through the Zones described, different electric potentials are applied to said boards. These differences generate electric voltages (potential differences) between the adjacent printed circuit boards 5 and 6 and between the boards 6 and 7 respectively. Meaning, local electrolytic cells form between two respective printed circuit boards that are placed in contact with the electrolyte fluid. The cell voltage of these local electrolytic cells is the electric voltage generated, which may differ locally.

Figure 2:
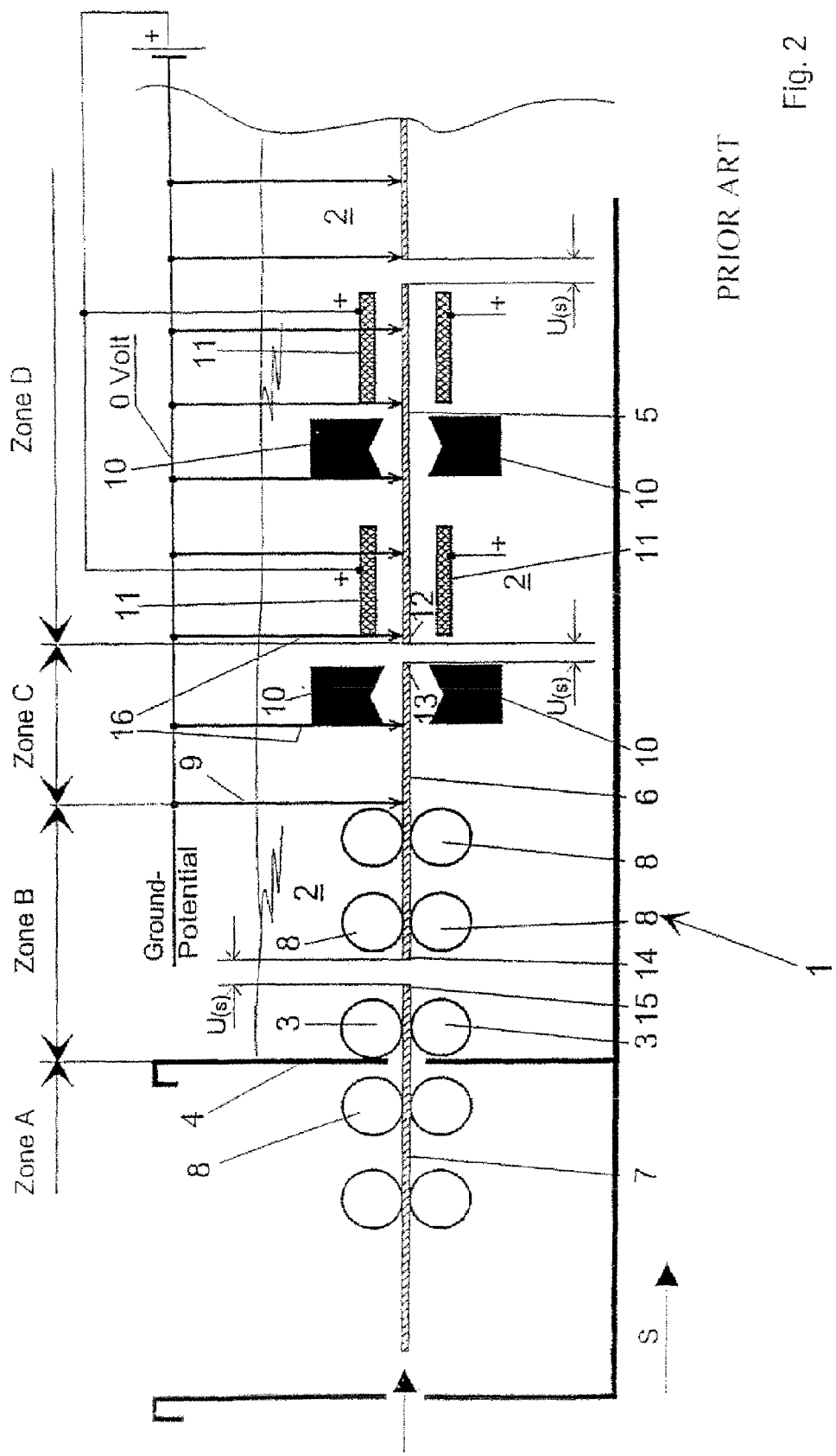
FIG. 2 is a view according to FIG. 1 indicating the electric voltage drops between adjacent boards.

FIG. 2 shows the electric potential differences generated in such a line.

In this case, the border region 12 of a first printed circuit board 5 is adjacent the border region 13 of a second printed circuit board 6. The spacing between the two printed circuit boards 5 and 6 amounts to about 10 mm for example. Voltages U(s) are generated over the distance separating these two printed circuit boards and also over the distance between the printed circuit boards 6 and 7. These voltages U(s) vary along the distance s covered by the printed circuit boards 5,6,7 inside the conveyorized plating line. The voltage U(s) particularly differs in the zones B and C described.

The electrolyte in the electrolyte space 2 in zone B establishes between the printed circuit board 7 and the anodes 11 a weakly conductive electric connection. As a result thereof, an anodic potential is formed at the border region 15 of the printed circuit board 7, which is partially in Zone B. Printed circuit board 6, by contrast, is already placed in low impedance electrical contact through the first contacting member 9 and through an additional electric contacting member 16. As a result thereof, this printed circuit board 6 is near ground potential, i.e., approximately at 0 volt. This results in a voltage U(s) being generated between the printed circuit boards 6 and 7. As compared to the ground potential, the potential of board 7 in the border region 15 is therefore positive. This results in the anodic region of the printed circuit board 7 being electrochemically etched.

As the boards are passed through the sealing or partition wall 4 and through the sealing rollers 3, the voltage U(s) between the adjacent boards 6 and 7 is at first small and amounts for example to about 50 millivolt. It increases as printed circuit board 7 is being conveyed through the line until said board 7 reaches the first contacting member 9 where a voltage value of about 500 millivolt is reached. The etch rate at the printed circuit board 7 also increases continuously.

In Zone C, the adjacent printed circuit boards 5 and 6 are placed in low impedance electrical contact through the contacting members 9 and 16. As a result thereof, the voltage U(s) between these two boards 5 and 6 tends to zero in this region of the line. In the border region 12 of the printed circuit board 5 and in the border region 13 of the printed circuit board 6, the metal is therefore hardly electrochemically etched.

The etch attack in Zone B, by contrast, is so strong that it may lead to quality problems during the electrolytic processing in the conveyorized plating line. How the boards are placed in electric contact at the contacting members 9 and 16 is thereby of minor importance. It has been found that a disturbing etch attack occurs with the contact being established by means of rollers, wheels or clamps alike.

Accordingly, the one board of each pair of adjacent printed circuit boards in a conveyorized plating line forms the anode and the other the cathode of an electrolytic cell formed by these two boards. The anode of this pair is electrochemically etched, meaning the top metallic layer is removed. This layer is the metal plated copper layer described herein above that has been deposited using an external current-free chemical method. The etch attack causes local voids to form in the chemical copper layer in the border region of the printed circuit boards. To avoid this is an object of the invention.

The solution to this object is to reduce/minimize the electric voltage between adjacent printed circuit boards in the line, an electric voltage U(s) of 0 volt being aimed at.

In a preferred embodiment of the invention, the conveyorized plating line therefore has at least one guard electrode provided for in the entrance region in which the printed circuit boards enter the line. In principle, a guard electrode may also be provided for in the exit region where the printed circuit boards exit the line in order to reduce or minimize, in that region as well, a disturbing effect of potential differences generated. The guard electrode serves to reduce or minimize the electric voltage between adjacent printed circuit boards in the line.

Preferably, the guard electrode is electrically connected to the ground potential (0 volt). It is disposed in the conveyorized plating line in such a manner that it substantially delimits the entrance region from the processing region of the printed circuit boards. The processing region for the printed circuit boards is the region that accommodates the anodes. A transition region is located between the entrance region and the processing region. In the transition region, the workpieces may already be placed in electric contact without reaching the region of the anodes, though.

A guard electrode disposed in this region applies a certain cathodic potential to the printed circuit board that happens to be there so that the electric voltage is reduced or minimized relative to the preceding board. The guard electrode is more specifically disposed in the transition region between Zone B and Zone C, and is preferably located, as viewed in the direction of transport, directly in front of the first electrical contacting member for the printed circuit boards (first time the printed circuit boards are placed in electric contact in Zone B).

In the line, the guard electrode is preferably disposed in such a manner that it does not touch the printed circuit boards as these are being conveyed through the line. Damage to the printed circuit boards is thus avoided. Moreover, the guard electrode does not wear under these circumstances so that it is almost maintenance-free.

As opposed to the anodes, the guard electrode is cathodically polarized and may be connected for this purpose to the negative pole of the current source. As a result thereof, the region lying in front of the guard electrode in the electrolyte space, as viewed in the direction of transport, (Zone B) is efficiently screened from the processing region with the potential in Zone B being adjustable through the cathodic potential of the guard electrode.

For a better adjustment of the cathodic potential of the guard electrode in Zone B in the electrolyte space, the guard electrode can be connected, by way of at least one limiting resistor, to the negative pole of the current source for electrolytic metal plating. If the limiting resistor is adjustable, the cathodic potential in Zone B may be adjusted with even greater accuracy. By adjusting the limiting resistor it is not only meant to regulate said resistor element but also to select a limiting resistor that has a suited resistance value. This more specifically permits to achieve an even better equalization of the potential of the printed circuit boards in the Zones B and C.

By selecting the number, the shape, the spatial arrangement and/or the size of the guard electrodes, the cathodic potential from one printed circuit board to the other in the region of the guard electrode may be further equalized so that the electric voltages between adjacent printed circuit boards are further reduced or minimized.

More specifically, the guard electrode can be made from an electrically conductive material that is also resistant to the chemicals utilized.

Another possibility to minimize the electric voltage between the adjacent printed circuit boards consists in supplying the respective contacting members, more specifically in the transition zone (Zone C) and in the first region of Zone D, with a lower voltage than the contacting members in the following Zone D. For this purpose, an electric resistance is more specifically connected between the respective one of the contacting members and the negative pole of the plating current source. These compensating resistors may for example be connected in parallel in the current supply line leading from the current source to the contacting members. The compensating resistors may also be connected in series between the contacting members in the current paths leading to the contact sites. More specifically in the case of a connection in parallel, the resistance values of these compensating resistors preferably vary from one contact site to the other.

The electric potential of the contacting members may be adjusted as a result thereof. Through the adjustability of the resistance values of these compensating resistors, meaning that they may be increased or reduced in size, the electric potential of the contacting members can be adjusted with even greater accuracy in order to reduce or minimize the electric voltage between adjacent printed circuit boards. By adjusting the resistance value of a compensating resistor it is not only meant to regulate a resistor element but also to select a compensating resistor that has an appropriate resistance value.

Generally, a plurality of contacting members are provided for in the conveyorized plating line e.g., a row of clamps that are disposed, as viewed in the direction of transport, one behind the other in a spaced relationship on an endless revolving belt which is supported on rolls and that take clampingly hold of the printed circuit boards, or several contacting rolls that are also disposed one behind the other in a spaced relationship and roll on the borders of the printed circuit boards, or several contact rollers that are also disposed one behind the other in a spaced relationship as viewed in the direction of transport and roll on the printed circuit boards.

In such a case, one compensating resistor can be assigned to a respective one of the contacting members in the transition region, the respective one of the compensating resistors being preferably connected in series in the current supply line between adjacent contacting members that are connected in parallel. In this case, the size of the various compensating resistors may be adjustable. As a result thereof, the voltage drops in the compensating resistors that are assigned to the individual contacting members are individually adjustable. The electric voltage between adjacent printed circuit boards may thus be minimized further through the at least one compensating resistor so that the cathodic potential of the printed circuit boards may be regulated and adjusted, also taking into consideration various geometric situations in the conveyorized plating line and various formats and other parameters of the printed circuit boards such as the thickness of the copper cladding, the circuit pattern (size of the area to be metal plated) and the type of metallization (possibly taking into consideration other metals that are to be found on the surfaces of the printed circuit boards).

In case at least two contacting members with electric compensating resistors were provided for, it further proved advantageous to adjust (or select) the compensating resistors so that the voltage drop is greatest in that compensating resistor which is assigned to the first contacting member as viewed in the direction of transport. As a result thereof, the potential differences usually generated in the transition region from Zone C to Zone D between the discrete printed circuit boards which happen to be in these regions are minimized.

In a particularly advantageous embodiment, the current supply is electrically connected to the electric contacting members for the workpieces through current lines and through a sliding contact rail or through brushes, the current path being divided into segments that are electrically isolated from one another in proximity to the entrance region of the line, i.e., in the end region of the current path facing the entrance region, more specifically in Zone C, a compensating resistor and a contacting member being assigned to a respective one of the discrete segments. A connection in series is thus obtained in which the voltage at the contacting members steadily decreases towards the transition region A, even if the values of the discrete resistances are equally high.

Compensating resistors are assigned to the contacting elements or to the contact rail segments preferably in the transition region and at the beginning of the processing region in the line but not in the remaining processing region.

Generally, the printed circuit boards are contacted with the electrolyte fluid in the electrolyte space by leading them into an electrolyte space filled with an electrolyte fluid as they are being conveyed through the line. For this purpose, they enter a space in which the fluid accumulates and exit said space once they have been conveyed through the line. Usually, sealing means are provided for this purpose at the entrance and exit for the printed circuit boards in order to retain the electrolyte fluid inside the electrolyte space. Such type sealing means are for example quite narrow slots in the tank walls through which the printed circuit boards enter or exit said tank and sealing rollers that are disposed directly behind said slots. Such sealing rollers seal the electrolyte space from the exterior space and largely prevent the electrolyte fluid from escaping from the electrolyte space. Normally, the sealing rollers are placed on top of each other in a close relationship and are only pushed apart by the printed circuit boards passing there through.

Figure 3:
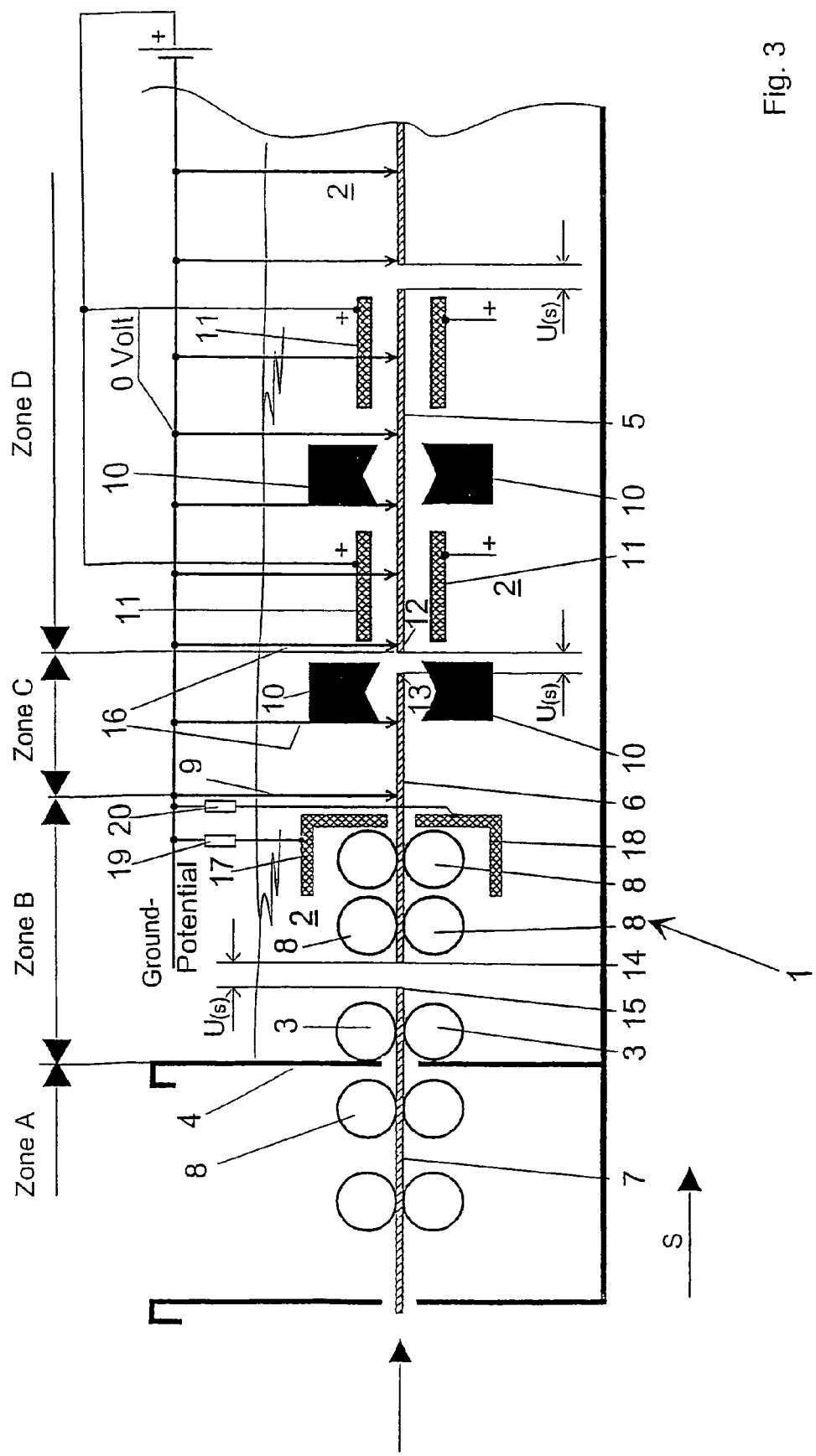
Figure 4:
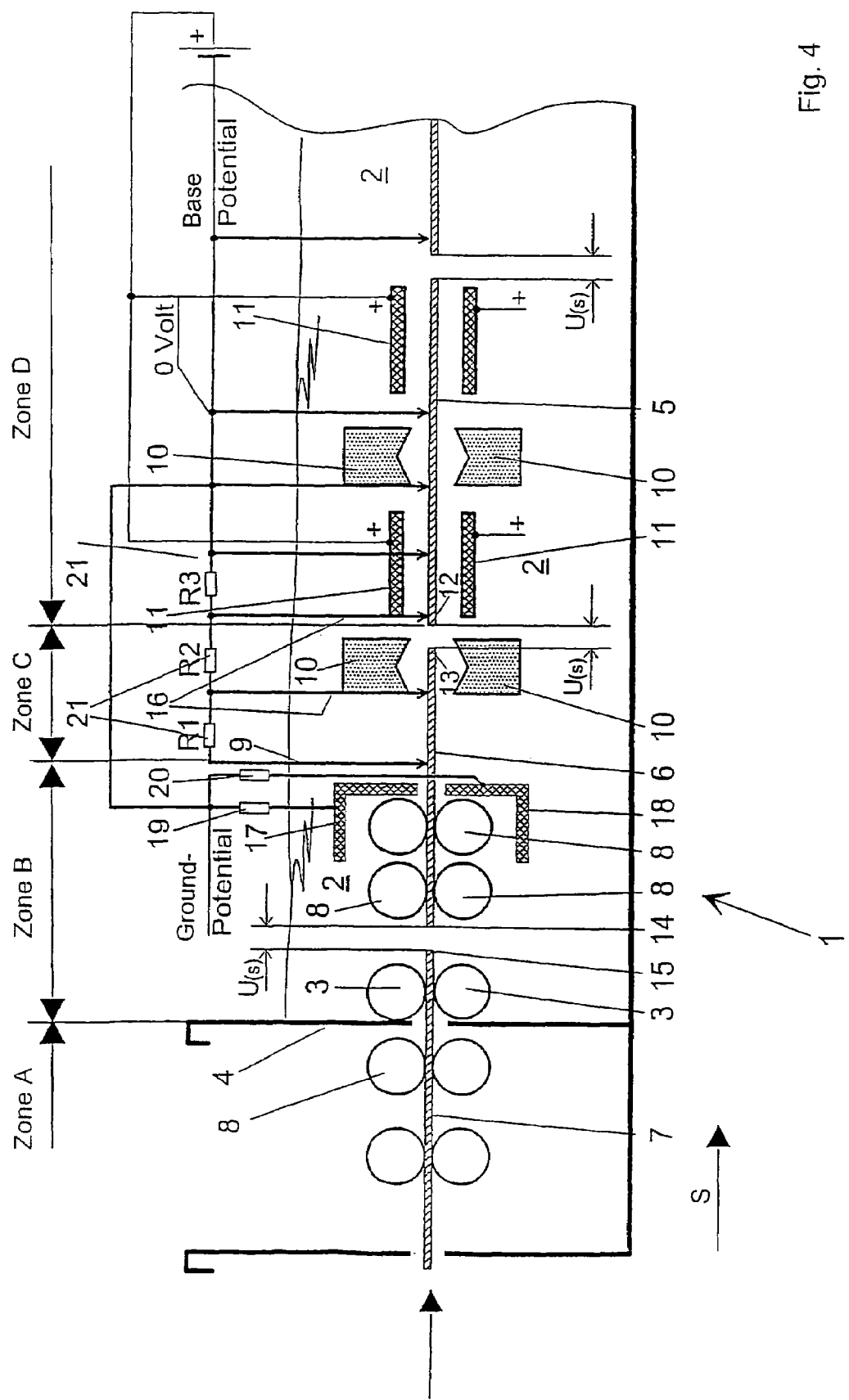
Figure 5:
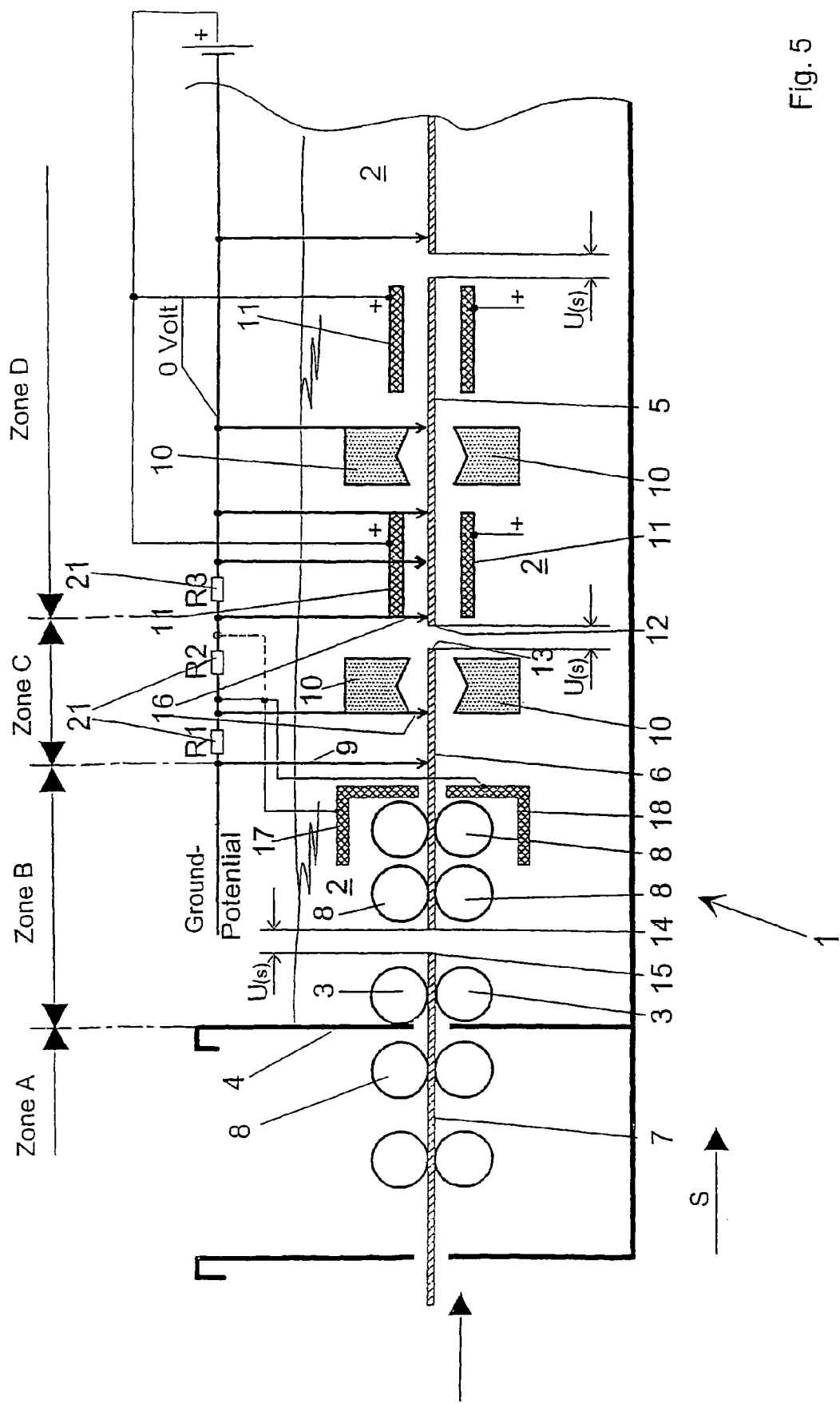

The FIGS. 3 to 5 serve to explain the invention in more detail.

FIG. 3: is a schematic cross-sectional view of the front region of an electroplating line with a guard electrode according to the invention and shows the reduction or minimization of the electric potential difference between adjacent printed circuit boards that may be obtained therewith;

FIG. 4: is a schematic cross-sectional view of the front region of an electroplating line with an additional inventive measure and shows the equalization of the potential differences that may be obtained therewith;

FIG. 5: is a schematic cross-sectional view of the front region of an electroplating line in which the guard electrode is contacted with a current source through compensating resistors that at the same time act as limiting resistors.

The front region of a conveyorized plating line according to the invention as it is illustrated in FIG. 3 has a tank 1 for the electrolyte fluid provided in an electrolyte space 2. The printed circuit boards 5,6,7 are conveyed through the line by means of stationary transport rollers 8. They enter the line, passing through an entrance slot provided in the sealing wall 4 and between sealing rollers 3. The slot in the sealing wall 4 is selected to be as narrow as possible in order to minimize electrolyte fluid escape. The sealing rollers 3 additionally seal the electrolyte space 2 from the exterior space so that a small amount of electrolyte fluid only is allowed to leak into the exterior space. The incoming printed circuit boards 5,6,7 raise the upper one of the two sealing rollers 3 to enter the electrolyte space 2. The printed circuit boards 5,6,7 are conveyed through the line in close succession. The spacing between two printed circuit boards is for example about 10 mm.

In an effort to avoid etch attack in the metal layers on the printed circuit boards 5,6,7, at least one guard electrode 17,18 is mounted according to the invention in the electrolyte space 2 in Zone B as shown in FIG. 3. Such a guard electrode 17,18 is preferably disposed both on the upper and on the lower side of the transport path on which the printed circuit boards 5,6,7 are conveyed. The guard electrodes 17,18 are made of a chemically resistant material that is electrically conductive on portions of the surface at least. Certain special steels, titanium or other acid-resistant, electrically conductive materials are suited there for.

The upper and lower guard electrodes 17,18 cause the printed circuit boards 5,6,7 in Zone B to be at a cathodic potential before said boards are electrically connected to the current supply through contacting members 9,16 as they are being passed through the line, so that the boards are then at ground potential 0 volt.

For this purpose, the printed circuit boards 5,6,7 are conveyed through the line in the direction indicated by an arrow. In the snapshot shown in FIG. 3, the printed circuit board 5 has already been conveyed farthest within the line and is already placed in electric contact by the contacting members 16. The printed circuit board 7, by contrast, only has its front region inside the electrolyte space 2. The rear region of this printed circuit board 7 is still in the exterior space of the line. The printed circuit board 6, which has already entered the line, is located between the two boards 5 and 7 in the Zones B and C. The center of this printed circuit board 6 is already placed in electric contact through the contacting member 9 and the front region thereof through the contacting members 16. Said printed circuit board 6 is also just about to pass the guard electrodes 17,18.

The guard electrodes 17,18 are in electric contact with the ground potential of the current source illustrated on the top right margin of the Fig.

In the electric connection between the guard electrodes 17,18 and the current supply, limiting resistors 19,20 are provided for, the cathodic potential of the guard electrodes 17,18 being adjustable by way of the resistance values thereof.

The action of the guard electrodes 17,18 is greatest when the limiting resistors 19,20 have a resistance value of ≈0 ohm. Then, the cathodic polarization of the guard electrodes 17,18 is so high that the polarity of the voltage U(s) between the printed circuit boards 6 and 7 is reversed. In these circumstances, the printed circuit board 7 is at a cathodic potential relative to the printed circuit board 6 so that an electrolytic cell forms between these two printed circuit boards. In this case, the border region 14 of the printed circuit board 6 is anodically polarized relative to the border region 15 of printed circuit board 7. Accordingly, there is a risk in this case that the printed circuit board 6 be etched. This overcompensation is avoided by the insertion of the limiting resistors 19,20 and by an appropriate adjustment of the values of these compensating resistors or by the suited selection of limiting resistors having the appropriate resistance values and/or by the reduction of the efficient surface of the guard electrodes 17,18. In this case, the limiting resistor is formed by the electrolyte. The values of the limiting resistors 19,20 are preferably set to range from 10 to 100 milliohm. Their dimensions are such that the potential of the guard electrodes 17,18 generates a voltage drop that approximately equals U(s), measured in volt, and that is opposed to the voltage U(s) between the printed circuit boards 6 and 7 so that the potential in the printed circuit boards 6 and 7 is equalized.

With only one of the two guard electrodes 17 or 18 being used, the cathodic potential is also equalized, although the effect is smaller.

A conveyorized plating line equipped in this way permits to avoid an etch attack of those printed circuit boards that happen to be in Zone B.

As soon as the printed circuit board 6 is placed for the first time in low impedance electrical contact at the first contacting member 9 and enters Zone C no electroplating current flows toward the printed circuit board 6 since said printed circuit board 6 is still in Zone B and has not yet reached the region of the anodes 11. Hence, but a small current flows through the contacting members 9. The electric voltage drops at the contacting member 9 along the path s are small.

The case is different with the printed circuit board 5 that has already reached Zone D. Here, the currents passing through the contacting members 16 are great. The voltage drops at these contacting members 16 are accordingly high. A voltage U(s) builds up between the border regions 12 and 13 of the printed circuit boards 5 and 6. The border region 12 of the printed circuit board 5 is positively polarized relative to the border region 13 of printed circuit board 6. Therefore, the border region 12 is electrochemically etched in Zone C.

Such an etch attack is avoided by the measure described with reference to FIG. 4. Compensating resistors 21 that are assigned to the contacting members 9,16 are inserted in the current paths of said contacting members 9,16. Said compensating resistors 21 are indicated at R1, R2 and R3; The number of compensating resistors 21 is determined by local conditions, more specifically by the number of contacting members 9,16 in the Zones C and D. Here, the compensating resistors R1, R2 and R3 are connected in series. The same effect is obtained by inserting a compensating resistor 21 into the current path of every contacting member 9,16 and by selecting for each resistor an appropriate resistance value.

The compensating resistors 21 are sized so that, at the electroplating current flowing through the contacting members 9,16, which is still small in Zone C, the voltage drop generated approximately equals the voltage drop generated at the compensating resistors 21 that are assigned to the contacting members 16 in Zone D. As a result thereof, the voltage U(s) between the printed circuit boards 5 and 6 is low in this Zone as well. Accordingly, no etch attack takes place in this Zone either. In conventional electroplating lines, the compensating resistor values for R1, R2, R3 range from about 100 milliohm to about 1 milliohm. The efficient compensating resistor value preferably decreases in the direction of transport of the printed circuit boards 5,6,7 because the current through the contacting members 9,16 increases.

Eventually, FIG. 5 shows another preferred embodiment of the present invention in which the limiting resistors 19 and 20 that were utilized in the embodiment according to FIG. 4 may be dispensed with. A simpler structure of the line is thus made possible. In order to permit in this case as well the adjustment of the cathodic potential of the guard electrodes 17,18, an appropriate potential between the compensating resistors 21 shown in the line according to FIG. 4 is scanned. In this connection tests showed that the size variation of the compensating resistors 21 is so small that in practice a suited connection site for placing the respective one of the guard electrodes 17,18 in electric contact can always be found in order to adjust the cathodic potential of the guard electrodes 17,18 to a value that allows the voltage U(s) between adjacent printed circuit boards to drop to zero, more specifically in the entrance region of the line.

In the present case, the potentials for the guard electrodes 17,18 between the compensating resistors R1 and R2 were scanned. If, when the guard electrodes are connected between the resistors R1 and R2 for example, the voltage is too low, the connection can be established between R2 and R3 as shown in a dashed line in FIG. 5.

For the rest, the features of the device in FIG. 5, which are not described in closer detail herein, correspond to the corresponding features of FIG. 3 and FIG. 4.

All of the potentials and voltage drops of the compensation measures generated in the discrete Zones increase as the current density increases and vice versa. Since greater current densities require greater compensation measures, the invention is almost independent of the current density used.

The invention is particularly advantageous in providing wear-free plating line elements. Only passive elements are used; more specifically, no sliding contact is used in order to shunt the disturbing electric voltages between the printed circuit boards.

Surprisingly, it has been found that the cathodic guard electrode(s) are metal plated to a minimum extent only. A slightly chemically etching electrolyte fluid suffices to prevent metallization of the guard electrodes. If it does not, the guard electrode 17 may be efficiently prevented from being metal plated by installing between the guard electrode 17 and the anode 11, or between the guard electrode 18 and the anode 11, a screen with an electrically non conductive surface that extends on the one side from the vicinity of the printed circuit board and terminates on the other side at the bath level or at the bottom of the tank. In this case, the measure of the invention is completely maintenance-free.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

LISTING OF NUMERALS 1 plating tank
2 electrolyte space
3 sealing rollers
4 sealing wall
5,6,7 printed circuit boards
8 transport roller
9 contacting member
10 delivering members for the electrolyte fluid (such as flow nozzles)
11 anodes
12 border region of the printed circuit board 5
13,14 border regions of the printed circuit board 6
15 border region of the printed circuit board 7
16 contacting member
17 upper guard electrode
18 lower guard electrode
19 limiting resistor of the guard electrode 17
20 limiting resistor of the guard electrode 18
21 compensating resistors of the contacting members 9,16
U(s) voltage between two border regions of a printed circuit board
s path traveled by the printed circuit boards 5,6,7 through the conveyorized plating line.

The invention claimed is:

1. A conveyorized plating line for electrolytically metal plating workpieces, wherein means (17,18,21) are provided to reduce an electric voltage that builds up between adjacent workpieces (5,6,7) being conveyed through the line, wherein the means are at least one guard electrode (17,18) that is provided for in the line, in an entrance region for the workpieces (5,6,7).

2. The conveyorized plating line according to claim 1, wherein the at least one guard electrode (17,18) substantially delimits the entrance region from a processing region for the workpieces (5,6,7) in which anodes (11) are disposed.

3. The conveyorized plating line according to one of the claims 1 and 2, wherein the at least one guard electrode (17,18) is disposed in such a manner that it does not touch the workpieces (5,6,7) as they are being passed through the line.

4. The conveyorized plating line according to one of the claims 1-2, wherein the at least one guard electrode (17,18) is cathodically polarizable relative to the anodes (11).

5. The conveyorized plating line according to one of the claims 1-2, wherein the at least one guard electrode (17,18) is connected to a current source for electrolytic metal plating through at least one limiting resistor (19,20).

6. The conveyorized plating line according to claim 5, wherein the at least one limiting resistor (19,20) is adjustable.

7. The conveyorized plating line according to one of the claims 1-2, wherein the number, the shape, the spatial arrangement and/or the size of the at least one guard electrode (17,18) are determined in view of the reduction of the electric voltage between adjacent workpieces (5,6,7) in the line.

8. The conveyorized plating line according to one of the claims 1-2, wherein at least one current source providing an electric current flow to the workpieces (5,6,7) is provided, wherein electrical contacting members (9,16) for the workpieces (5,6,7) are provided and wherein at least one electric compensating resistor (21) is provided for in a current path leading from the current source to the contacting members (9,16).

9. The conveyorized plating line according to claim 8, wherein the at least one current source is electrically connected to the electrical contacting members (9,16) for the workpieces (5,6,7) through current, lines and a contact rail or brushes, at least one electric compensating resistor being mounted in series in proximity to the entrance region of the line and the contacting members being connected to either end of the at least one compensating resistor.

10. The conveyorized plating line according to claim 8, wherein the at least one compensating resistor (21) is adjustable.

11. The conveyorized plating line according to claim 8, wherein, if at least two contacting members (9,16) are provided, the compensating resistor (21) are adjustable in such a manner that the voltage drop is greatest in that compensating resistor (21) which is assigned to the first contacting member (9) as viewed in the direction of transport.

12. The conveyorized plating line according to one of claims 1-2, wherein, for contacting the workpieces (5,6,7) with the electrolyte fluid as they are being passed through the line a space in which the electrolyte fluid accumulates is provided which the workpieces (5,6,7) can enter and which the workpieces (5,6,7) can exit again once the have been conveyed through the line.

\* \* \* \* \*